United States Patent
Honna et al.

(12) 
(10) Patent No.: US 6,316,324 B1
(45) Date of Patent: *Nov. 13, 2001

(54) METHOD OF MANUFACTURING SEMICONDUCTOR DEVICE WITHOUT FORMING SELECTIVE REGION BY LITHOGRAPHY

(75) Inventors: Katsu Honna, Kawasaki; Yasuhiro Dohi, Yokohama; Yasuko Anai; Takashi Kyuho, both of Kitakyushu; Kazuhiro Sato, Kawasaki, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/741,774

(22) Filed: Nov. 5, 1996

(30) Foreign Application Priority Data

Nov. 6, 1995 (JP) ..................................... 7-287396

(51) Int. Cl.[7] .................................................. H01L 21/331
(52) U.S. Cl. .......................... 438/372; 438/369; 438/364; 438/309; 438/378
(58) Field of Search ..................... 438/229, 369, 438/370, 373, 309, 364, 378, 372, FOR 165; 148/DIG. 10

(56) References Cited

U.S. PATENT DOCUMENTS

| 5,071,778 | * | 12/1991 | Solheim | ............................... 438/370 |
| 5,424,572 | * | 6/1995 | Solheim . | |
| 5,439,833 | * | 8/1995 | Herbert et al. . | |
| 5,443,994 | * | 8/1995 | Solheim . | |
| 5,466,615 | * | 11/1995 | Tsai . | |
| 5,466,960 | * | 11/1995 | Ilderem et al. . | |

OTHER PUBLICATIONS

S. Wolf, Silicon Processing for the VLSI Era, V1–V2, pp. 198–219 and 510–525, respectively, 1990.*
S.M. Sze VLSI Technology, 2nd edition, pp. 121–125, 1988.*

* cited by examiner

Primary Examiner—Charles Bowers
Assistant Examiner—Scott J. Hawranek
(74) Attorney, Agent, or Firm—Finnegan, Henderson, Farabow, Garrett & Dunner, L.L.P.

(57) ABSTRACT

A method of manufacturing a semiconductor device includes the step of doping an N-type impurity via a selective region formed on a semiconductor substrate by lithography, the step of doping a P-type impurity in the semiconductor substrate subsequent to the doping step without forming a selective region by lithography, and the step of self-alignedly forming an N-diffusion layer and a P-diffusion layer by performing wet oxidation with respect to the semiconductor substrate in which the N-type impurity and the P-type impurity are doped.

16 Claims, 15 Drawing Sheets

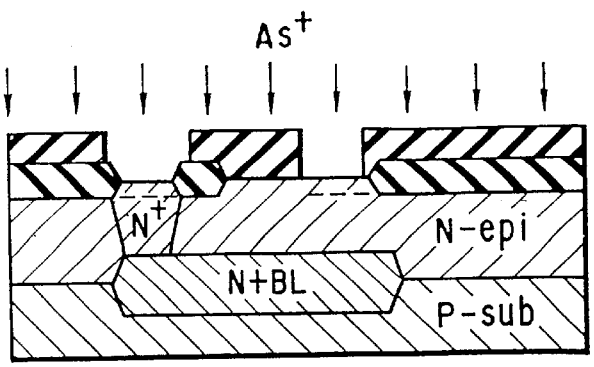
F I G. 1A
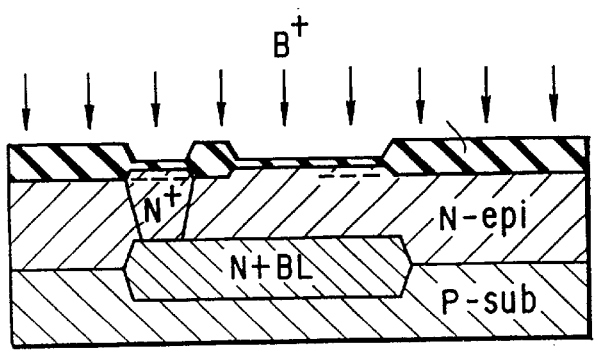
F I G. 1B
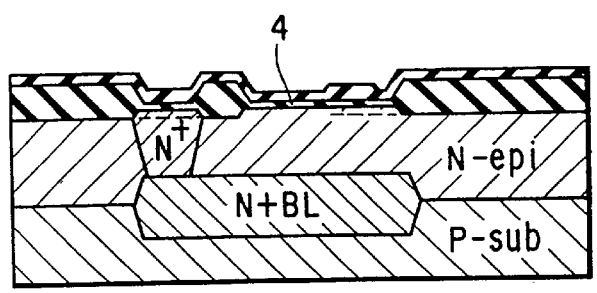
F I G. 1C
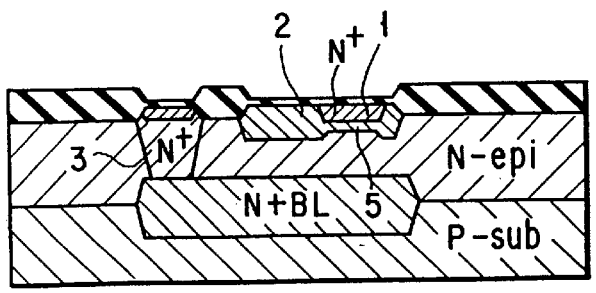
F I G. 1D

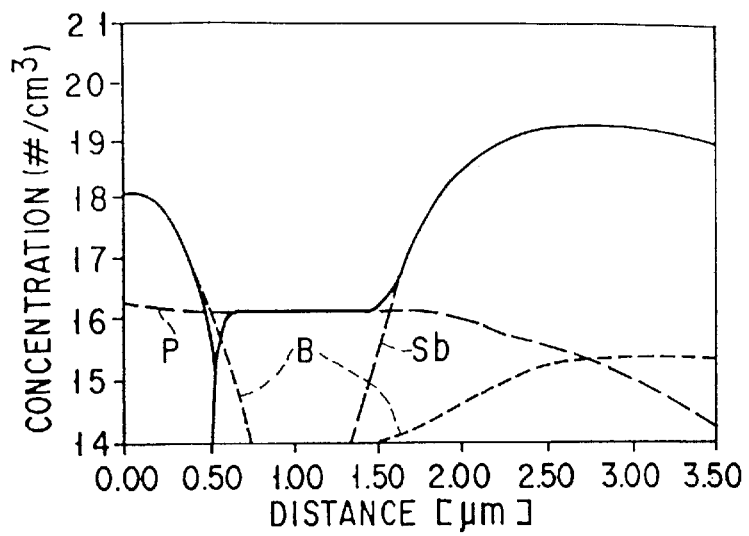
F I G. 3A
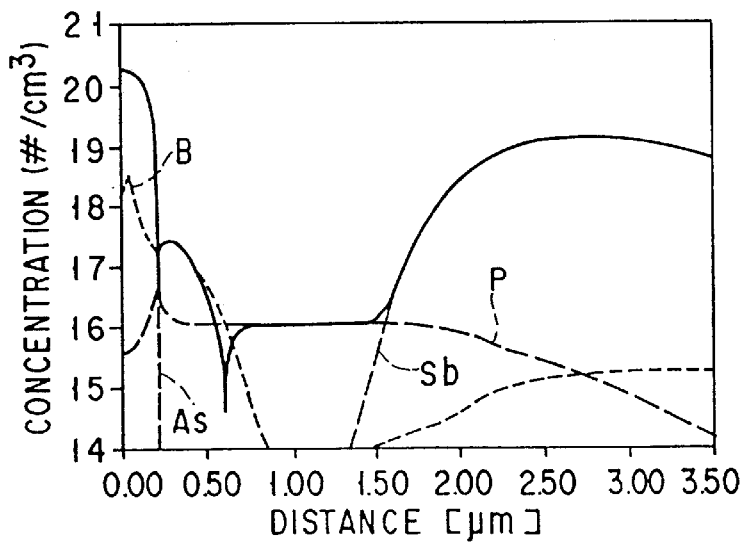
F I G. 3B

PROFILE IMMEDIATELY BELOW NMOS GATE

|  | DOSE | ACCELERATION VOLTAGE |
|---|---|---|
| N-TYPE IMPURITY | $3E15cm^{-2}$ | 40keV |
| P-TYPE IMPURITY | $1.24E15cm^{-2}$ | 35keV |

PROFILE IMMEDIATELY BELOW NMOS DRAIN / SOURCE

|  | DOSE | ACCELERATION VOLTAGE |
|---|---|---|
| N-TYPE IMPURITY | $3E15 cm^{-2}$ | 40 keV |
| P-TYPE IMPURITY | $1.24E15 cm^{-2}$ | 35 keV |

IMMEDIATELY BELOW NMOS DRAIN/SOURCE

|  | DOSE | ACCELERATION VOLTAGE |
|---|---|---|
| N-TYPE IMPURITY | 3E15 cm$^{-2}$ | 40keV |
| P-TYPE IMPURITY | 5E14 cm$^{-2}$ | 5keV |
| WET OXIDATION | 950°C | 30 MIN. |

PROFILE IMMEDIATELY BELOW PMOS GATE

|  | DOSE | ACCELERATION VOLTAGE |
|---|---|---|
| N-TYPE IMPURITY | $3E15 cm^{-2}$ | 40 keV |
| P-TYPE IMPURITY | $1.24E15 cm^{-2}$ | 35 keV |

PROFILE IMMEDIATELY BELOW PMOS DRAIN/SOURCE

|  | DOSE | ACCELERATION VOLTAGE |
|---|---|---|
| N-TYPE IMPURITY | $3E15 cm^{-2}$ | 40 keV |
| P-TYPE IMPURITY | $1.24E15 cm^{-2}$ | 35 keV |

PROFILE IMMEDIATELY BELOW PMOS DRAIN / SOURCE

|  | DOSE | ACCELERATION VOLTAGE |
|---|---|---|
| N-TYPE IMPURITY | $3E15 cm^{-2}$ | 40keV |
| P-TYPE IMPURITY | $5E14 cm^{-2}$ | 5keV |
| WET OXIDATION | 950°C | 30 MIN. |

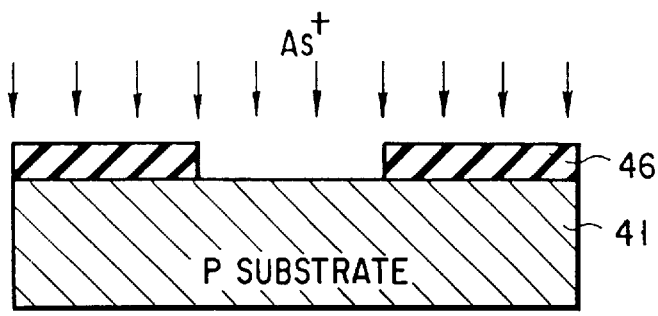
F I G. 13A
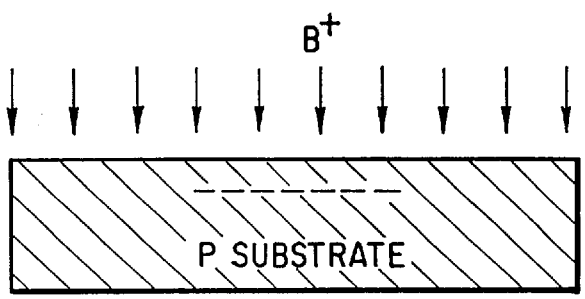
F I G. 13B
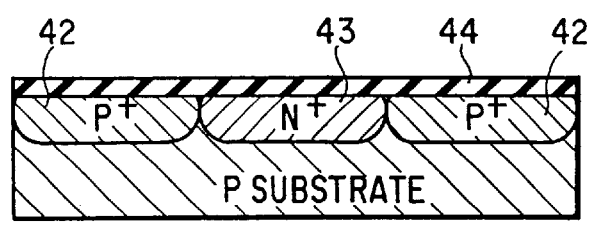
F I G. 13C
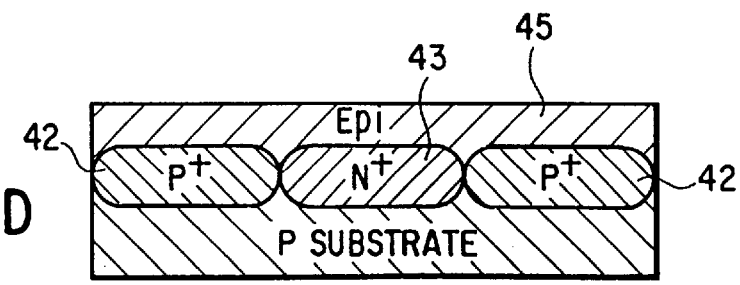
F I G. 13D

|  | ION DOSE | ACCELERATION VOLTAGE |
|---|---|---|
| EMITTER | $3.0 \times 10E\ 15\ cm^{-2}$ | 40 keV |
| BASE | $2.0 \times 10E\ 15\ cm^{-2}$ | 5 keV |

F I G. 15A

|  | ION DOSE | ACCELERATION VOLTAGE |
|---|---|---|
| EMITTER | $3.0 \times 10E\ 15\ cm^{-2}$ | 40 keV |
| BASE | $4.0 \times 10E\ 13\ cm^{-2}$ | 40 keV |

F I G. 15B

METHOD OF MANUFACTURING SEMICONDUCTOR DEVICE WITHOUT FORMING SELECTIVE REGION BY LITHOGRAPHY

BACKGROUND OF THE INVENTION

1. Field of the Invention

The present invention relates to a method of manufacturing a semiconductor device.

2. Description of the Related Art

FIGS. 14A to 14D are views for explaining a method of manufacturing a vertical NPN transistor as an example of a semiconductor device.

First, as shown in FIGS. 14A and 14B, selective ion implantation or thermal diffusion using a P-type impurity (e.g., boron $B^+$) is performed to form a base region 100. As shown in FIGS. 14B and 14C, an emitter region 101 is formed by selective ion implantation or thermal diffusion using an N-type impurity (e.g., arsenic $As^+$). After this formation of the emitter region 101, a P-type impurity (e.g., boron $B^+$) is selectively ion-implanted or thermally diffused again in a contact region of the base region 100 to form an inner base region 102, as shown in FIGS. 14C and 14D.

When the vertical NPN transistor is to be formed by the above conventional manufacturing method, however, a patterning (to be referred to as lithography hereinafter) step using a photosensitive resin (to be referred to as a resist hereinafter) must be performed when the base region 100, emitter region 101, and inner base region 102 are formed, respectively. As a result, the manufacturing time and cost are increased. In addition, an alignment shift in lithography must be taken into consideration, which limits a reduction in device size.

Such a problem similarly arises in forming N- and P-well layers, in forming N- and P-buried layers, and in forming N- and P-diffusion layers.

SUMMARY OF THE INVENTION

It is therefore an object of the present invention to provide a method of manufacturing a semiconductor device which can shorten the manufacturing time and reduce the manufacturing cost by simplifying the manufacturing method in the prior art, and can reduce the size of a device pattern.

To achieve the above object, a method of manufacturing a semiconductor device according to the present invention comprises the step of doping an N-type impurity via a selective region formed a semiconductor substrate by lithography, the step of doping a P-type impurity in the semiconductor substrate subsequent to the doping step without forming a selective region by lithography, and the step of self-aligningly forming an N-diffusion layer and a P-diffusion layer by performing wet oxidation with respect to the semiconductor substrate in which the N-type impurity and the P-type impurity are doped.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1D are views for explaining a method of manufacturing a vertical NPN transistor according to the first embodiment of the present invention;

FIGS. 3A to 3C are graphs showing the simulation results of a base region, an emitter region, and a collector region which are formed by the prior art;

FIGS. 13A to 13D are views for explaining a method of manufacturing a buried layer according to the fifth embodiment of the present invention;

FIG. 15A is a table showing the acceleration voltage and the ion dose used in the simulation in the first embodiment, while FIG. 15B is a table showing the acceleration voltage and the ion dose in the prior art.

DETAILED DESCRIPTION OF THE PREFERRED EMBODIMENTS

Figure 2A:
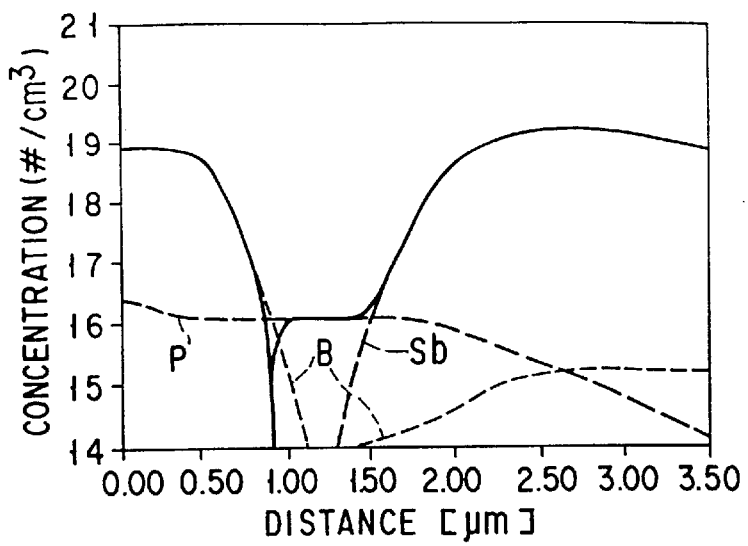
FIGS. 2A to 2C are graphs showing the simulation results of a base region, an emitter region, and a collector region when the first embodiment is carried out.

Embodiments of the present invention will be described below with reference to the accompanying drawings.

FIGS. 1A to 1D are views for explaining a method of manufacturing a vertical NPN transistor according to the first embodiment of the present invention. In the first embodiment, the inner/outer base of the vertical NPN transistor is formed self-aligningly. First, an N-type impurity (e.g., arsenic: $As^+$) is selectively ion-implanted or thermally diffused in an emitter region by using a lithography technique (FIG. 1A). After a resist is removed, a P-type impurity (e.g., boron: $B^+$) is ion-implanted or thermally diffused in the entire surface using a field oxide film as a mask without performing lithography (FIG. 1B). Note that the P-type impurity may be $BF_2$. Then, wet oxidation is performed in an $H_2/O_2$ or $H_2O$ atmosphere to form an oxide film 4 (FIG. 1C). Note that this embodiment uses wet oxidation whose oxidation rate is higher than that of dry oxidation.

At this time, the oxidation progresses faster in a region containing the N-type impurity than in a region containing no N-type impurity, and the oxide film 4 which is formed on an N-type impurity region has a larger thickness compared with the thickness of the oxide film 4 formed on the other regions.

In addition, since the diffusion coefficient of the P-type impurity is larger than those of the N-type impurity, the P-type impurity is mainly absorbed into the oxide film 4 having a larger thickness, as far as a region containing both the N-type and the P-type impurities are concerned. As a result of this, a large amount of N-type impurity remains in the substrate and the P-type impurity remains in the other regions.

Thereafter, annealing is performed to simultaneously form an emitter region and a base region by diffusion. At this time, the P-type impurity is diffused deeper than the N-type impurity because the P-type impurity has a larger diffusion coefficient. Therefore, an emitter region 1 and a base region 2 are obtained, as shown in FIG. 1D.

Further, since the P-type impurity is absorbed into the oxide film 4, the base region 2 immediately below the emitter region 1 is lower in concentration than the remaining base region. As a result, an inner base 5 is also formed.

With the above steps, the vertical NPN transistor is formed. In this NPN transistor, a deep $N^+$-buried diffusion layer formed on the P Si-substrate serves as a collector 3, a P-diffusion layer formed at an upper portion of an N-epitaxial layer serves as the base region 2, and an N-diffusion layer formed at an upper portion of the base region 2 serves as the emitter region 1.

Figure 2B:
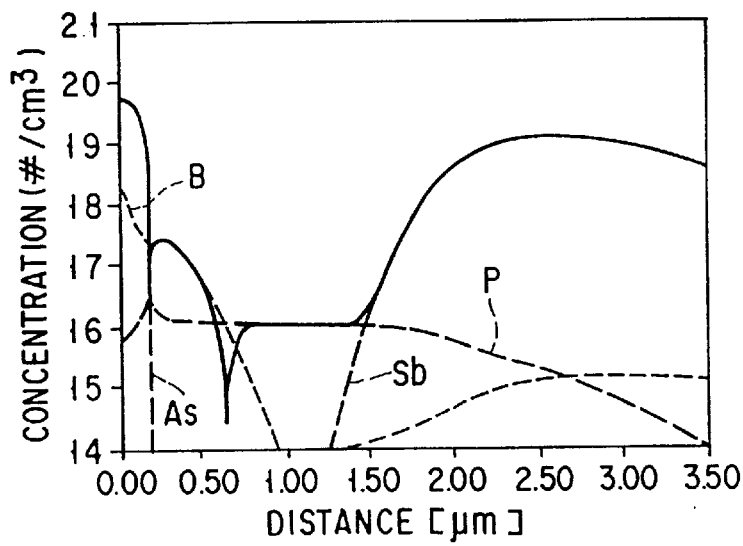
Figure 2C:
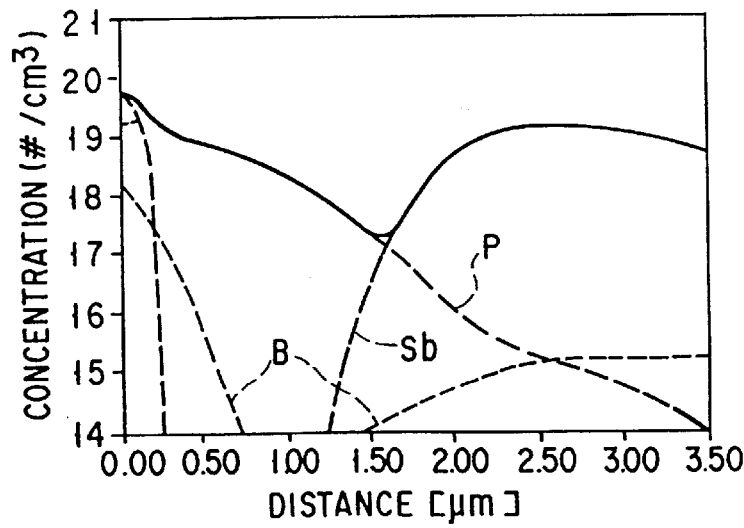
Figure 3C:
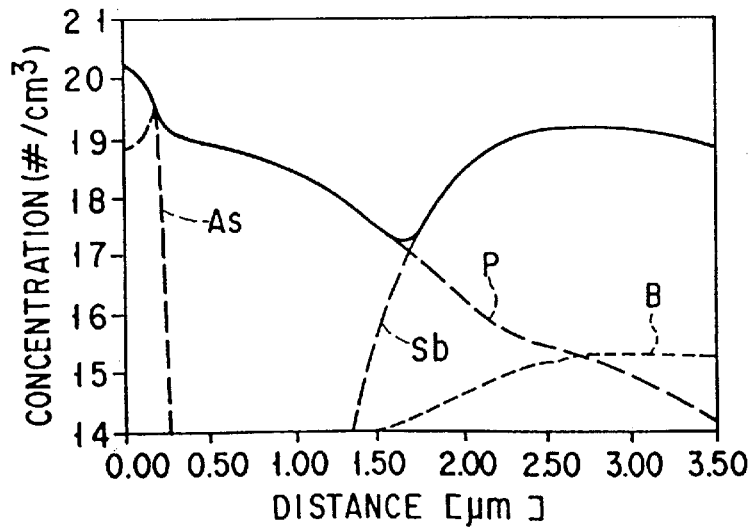

FIGS. 2A to 2C show the simulation results of the relationships between the depth from the substrate surface and respective impurity concentrations in the base (FIG. 2A), the emitter (FIG. 2B), and the collector region (FIG. 2C) when the first embodiment is carried out. FIGS. 3A to 3C show the simulation results of the relationships between the depth from the substrate surface and respective impurity concentrations in a base (FIG. 3A), an emitter (FIG. 3B), and a collector region (FIG. 3C) which are formed by the prior art. In this simulation, arsenic (As) was used as an N-type impurity, boron (B) was used as a P-type impurity, and ions were implanted using an ion implantation method. Oxidation after the impurity implantation was performed in an $H_2/O_2$ atmosphere at 950° C. for 30 min. The acceleration voltage and the ion dose used in the simulations for the respective regions are shown in FIG. 15A for this embodiment and in FIG. 15B for prior art.

As is apparent from comparisons between FIGS. 2A to 2C and FIGS. 3A to 3C, almost the same impurity profiles as those of the prior art are obtained by the manufacturing method of this embodiment.

According to the first embodiment, the process time and the manufacturing cost can be reduced, because lithography steps for forming the base region 2, the inner base region 5 and the emitter region 1 can be eliminated, compared to those in forming a vertical NPN transistor by the prior art. In addition, since the emitter and base regions are formed self-aligningly, lithography steps for forming the regions can be eliminated. Therefore, an alignment shift at the time of mask alignment need not be taken into account, and a pattern area can be reduced.

A manufacturing process according to the second embodiment of the present invention will be explained with reference to FIGS. 4A to 4D. In the second embodiment, the inner/outer base of a vertical NPN transistor is formed self-aligningly. In this embodiment, no deep $N^+$-buried diffusion layer is formed, unlike in the first embodiment.

Figure 4A:
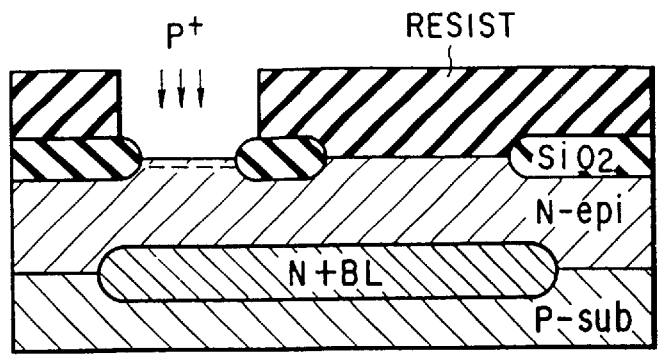
FIGS. 4A to 4D are views for explaining a method of manufacturing a vertical NPN transistor according to the second embodiment of the present invention.
Figure 4B:
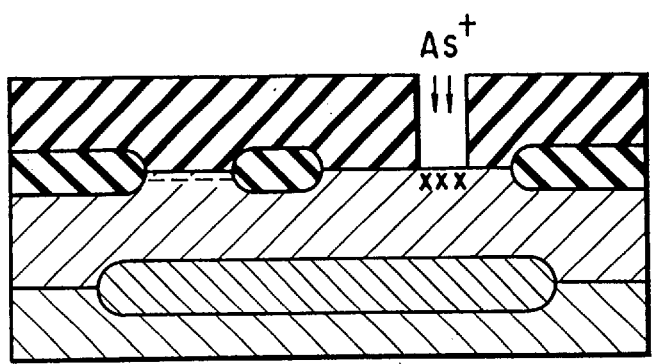
Figure 4C:
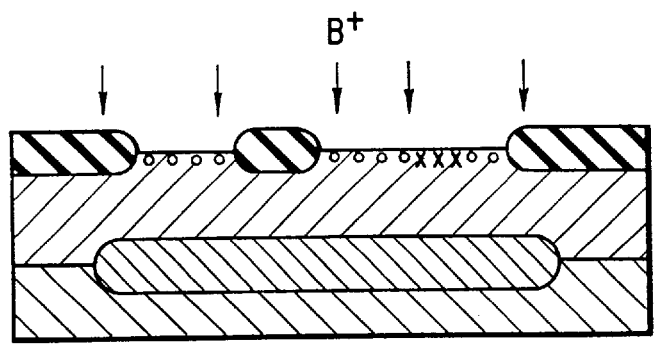

First, an N-type impurity (e.g., phosphorus: $P^+$) is selectively doped in a portion which will serve as a collector electrode (doping of ions includes ion implantation or vapor-phase diffusion; FIG. 4A). An N-type impurity (e.g., arsenic: $As^+$) is selectively doped in a portion which will serve as an emitter electrode (FIG. 4B). A P-type impurity (e.g., boron: $B^+$) is implanted in the entire surface of the device region (FIG. 4C). Note that the P-type impurity may be $BF_2$. Thereafter, the entire surface of the device region is wet-oxidized in an $H_2/O_2$ or $H_2O$ atmosphere to form an oxide film 14 (FIG. 1C). At this time, the oxidation progresses faster in a region containing the N-type impurity than in a region containing no N-type impurity, and the oxide film 14 which is formed on an N-type impurity region has a larger thickness compared with the thickness of the oxide film 14 formed on the other regions.

Figure 4D:
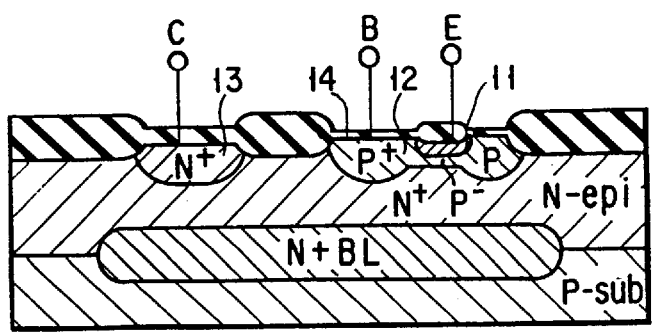

In addition, since the diffusion coefficient of the P-type impurity is larger than those of the N-type impurity, the P-type impurity is mainly absorbed into the oxide film 14 having a larger thickness, as far as a region containing both the N-type and the P-type impurities are concerned. As a result of this, a large amount of N-type impurity remains in the substrate and the P-type impurity remains in the other regions. With this step, a collector 13, inner and outer bases 12, and an emitter 11 are self-aligningly formed to complete the vertical NPN transistor (FIG. 4D).

According to the second embodiment, a resist patterning step and an implantation step for forming an inner base and a resist patterning step for forming an outer base, which are conventionally performed, are eliminated to reduce the manufacturing cost.

In addition, since the emitter and base regions are formed self-aligningly, lithography steps for forming the regions can be eliminated. Therefore, an alignment shift at the time of mask alignment need not be taken into account, and a pattern area can be reduced.

Figure 5A:
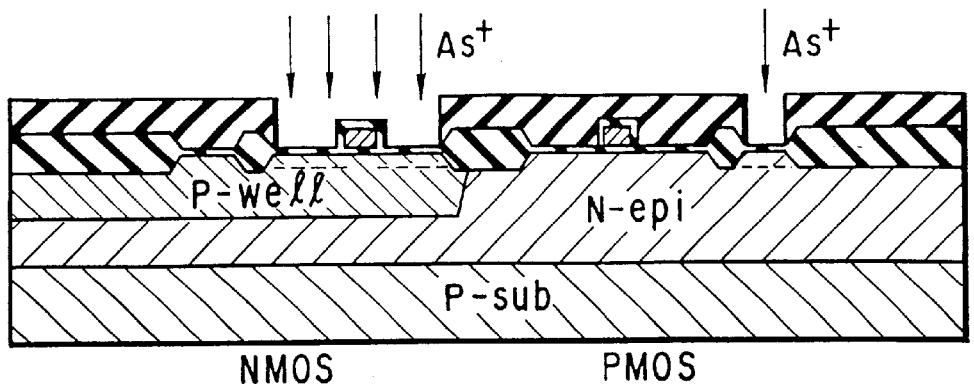
FIGS. 5A to 5C are views for explaining a method of manufacturing a CMOS transistor according to the third embodiment of the present invention.
Figure 5B:
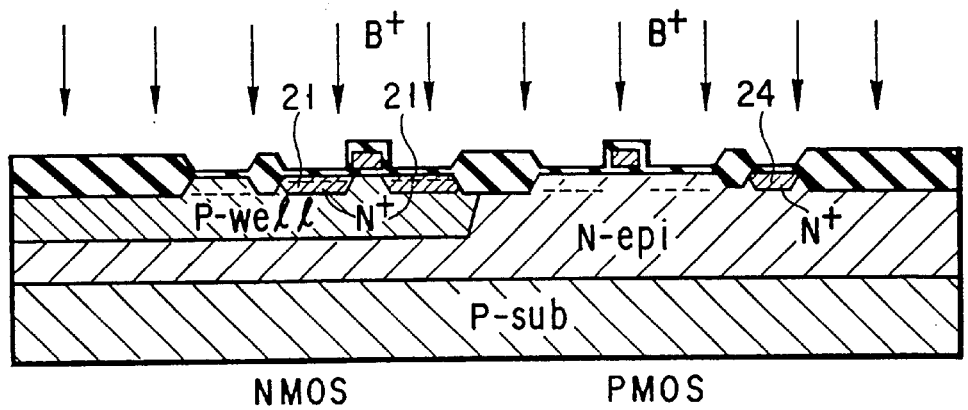
Figure 5C:
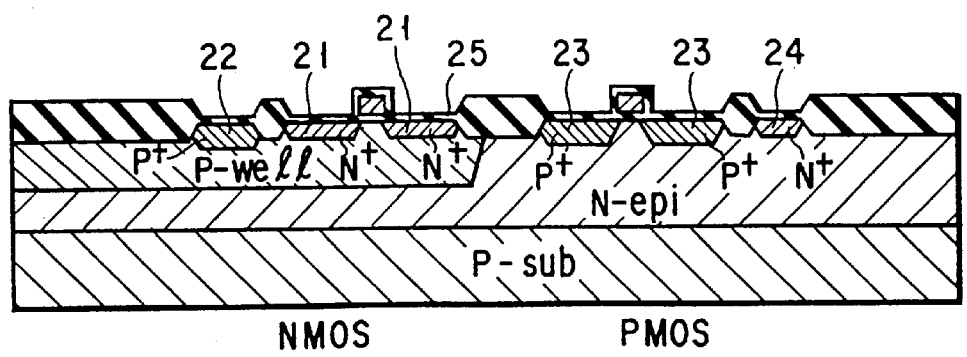

The third embodiment of the present invention will be explained below with reference to FIGS. 5A to 5C to FIGS. 11A to 11B. In the third embodiment, the N/P-type impurity region of a CMOS transistor is formed self-aligningly. First, as shown in FIGS. 5A and 5B, an N-type impurity (e.g., arsenic $As^+$ or phosphorus) is selectively ion-implanted or thermally diffused using a lithography technique to form source and drain diffusion layers 21 of an NMOS transistor and a back gate diffusion layer 24 of a PMOS transistor. As shown in FIGS. 5B and 5C, a P-type impurity (e.g., boron $B^+$) is ion-implanted or thermally diffused in the entire surface of a wafer without any lithography step to form source and drain diffusion layers 23 of the PMOS and a back gate diffusion layer 22 of the NMOS transistor. Wet oxidation is performed in an $H_2/O_2$ or $H_2O$ atmosphere to form oxide films 25 on the substrate.

If the P-type impurity (e.g., boron) is ion-implanted or thermally diffused in the entire surface of the wafer, the P-type impurity is also implanted in the source and drain diffusion layers 21 of the NMOS transistor and the back gate diffusion layer 24 of the PMOS transistor.

At this time, as far as the source and drain diffusion layer 21 of the NMOS transistor and the back gate diffusion 24 of the PMOS transistor containing the N-type impurity are concerned, the oxidation progresses faster compared with a region containing no N-type impurity, and the oxide film 25 which is formed on an N-type impurity region has a larger thickness compared with the thickness of the oxide film 25 formed on the other regions.

In addition, since the diffusion coefficient of the P-type impurity is larger than those of the N-type impurity, the P-type impurity is mainly absorbed into the oxide film 25 having a larger thickness, as far as the layers 21 and 24 containing both the N-type and the P-type impurities are concerned. As a result of this, a large amount of N-type impurity remains in the layers 21 and 24 and the P-type impurity remains in the other regions. Therefore, the N- and P-type impurity regions of the CMOS transistor are formed self-aligningly.

Figures 6A, 6B:
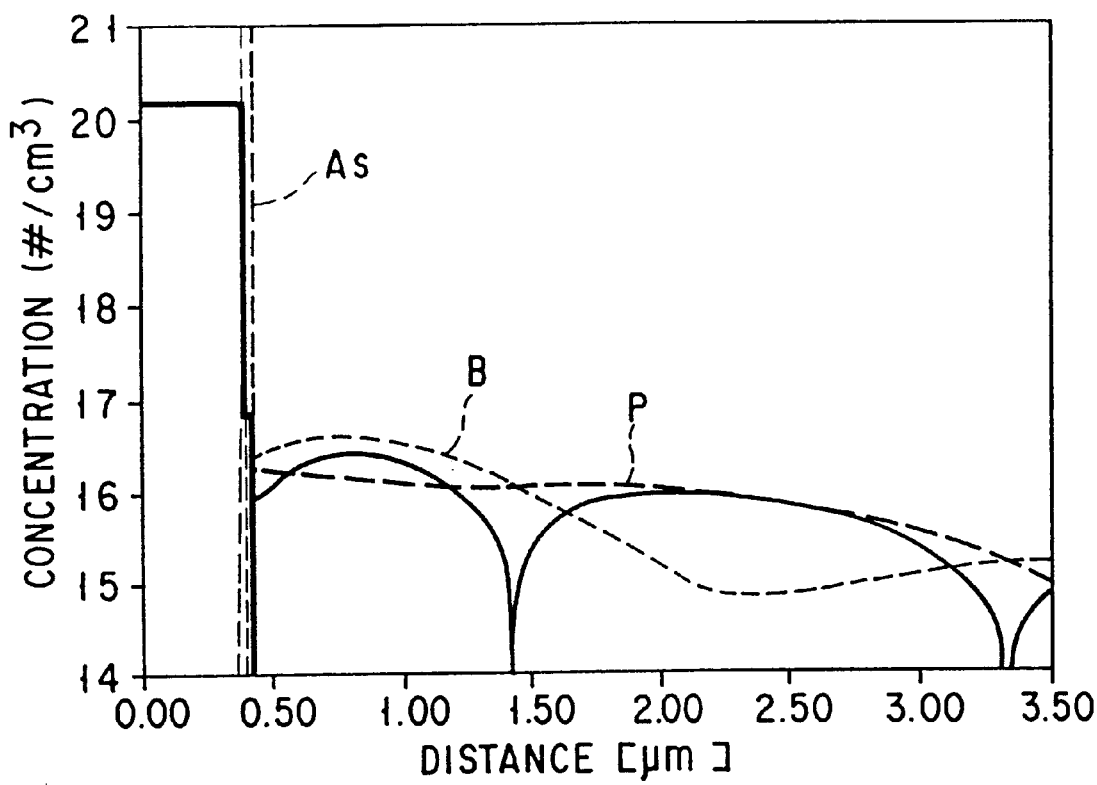
FIGS. 6A and 6B are a graph and a table respectively showing a simulation result immediately below the gate of an NMOS in the prior art.
Figures 7A, 7B:
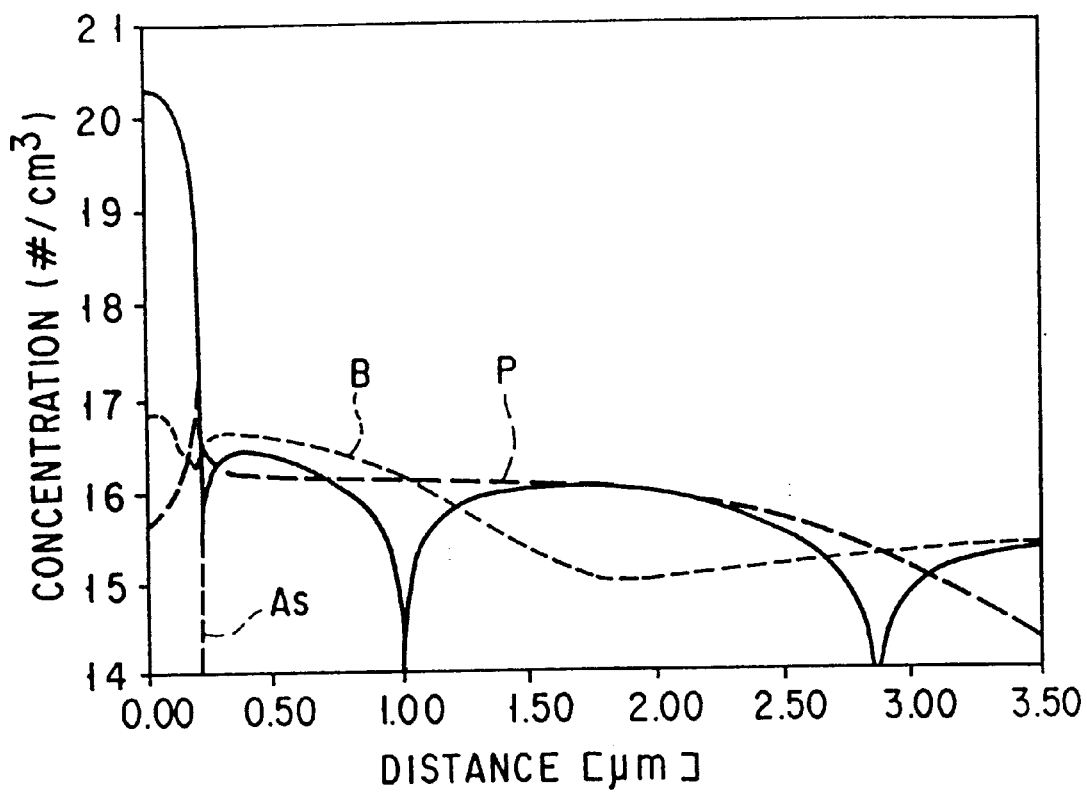
FIGS. 7A and 7B are a graph and a table respectively showing a simulation result immediately below the drain/source of the NMOS in the prior art.
Figures 8A, 8B:
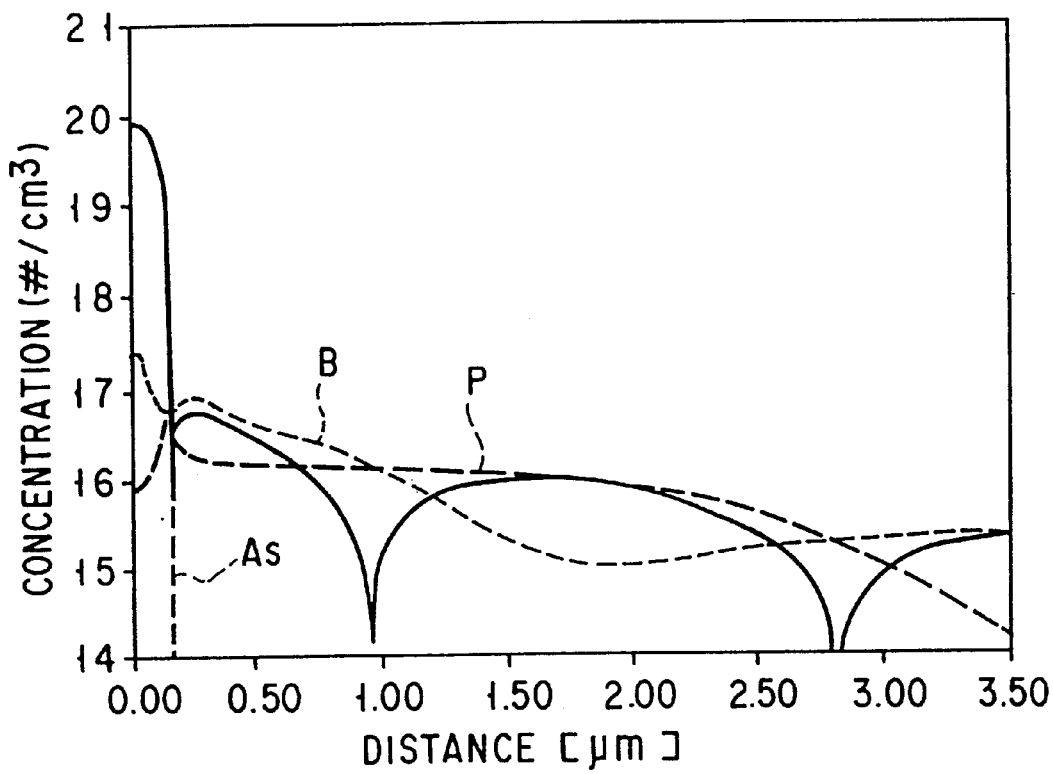
FIGS. 8A and 8B are a graph and a table respectively showing a simulation result immediately below the drain/source of an NMOS in the third embodiment.

FIGS. 6A, 6B, 7A, and 7B show the simulation results of the relationships between the impurity concentrations and the depth from the substrate surface in the prior art. FIGS. 8A and 8B show the simulation result of the relationship between the impurity concentration and the depth from the substrate surface in the third embodiment. In particular, FIG. 6A represents the impurity profile immediately below the gate of an NMOS transistor, and FIG. 7A represents the impurity profile immediately below the source/drain of the NMOS transistor. FIG. 8A represents the impurity profile immediately below the source/drain of an NMOS transistor. FIGS. 6B, 7B, and 8B show the dose and the acceleration voltage used at that time. As is apparent from a comparison between FIGS. 7A and 8A, almost the same impurity profile as that of the conventional manufacturing process is also obtained in this embodiment.

Figures 9A, 9B:
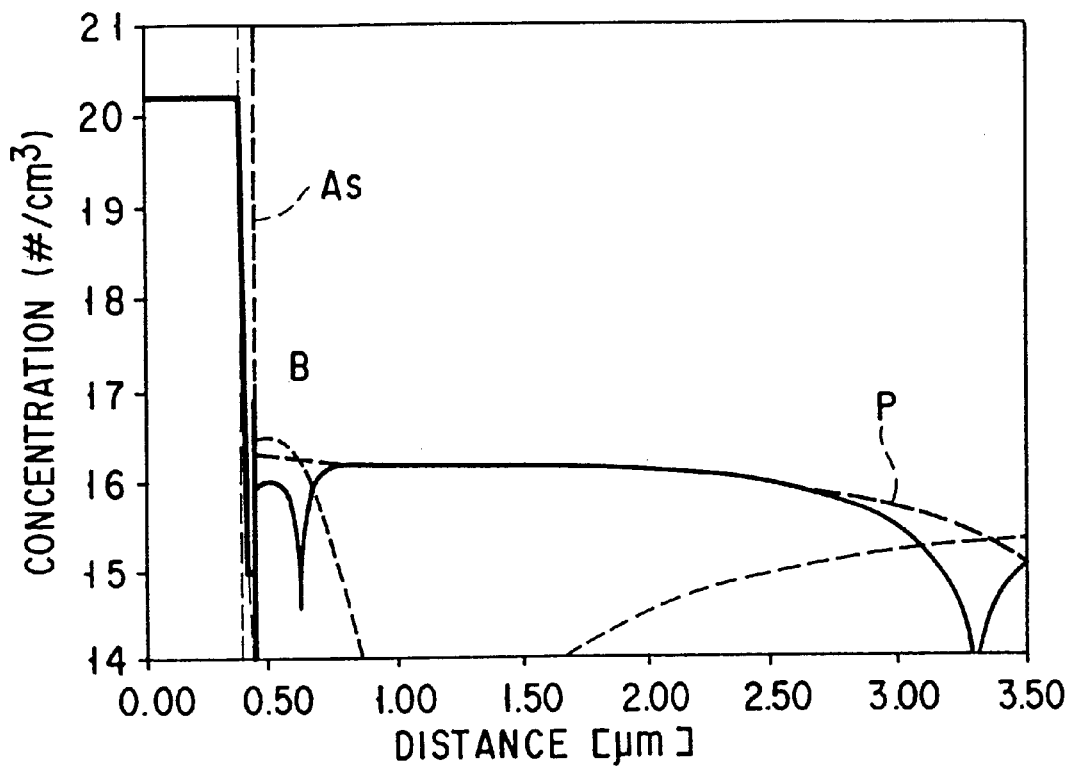
FIGS. 9A and 9B are a graph and a table respectively showing a simulation result immediately below the gate of a PMOS in the prior art.
Figures 10A, 10B:
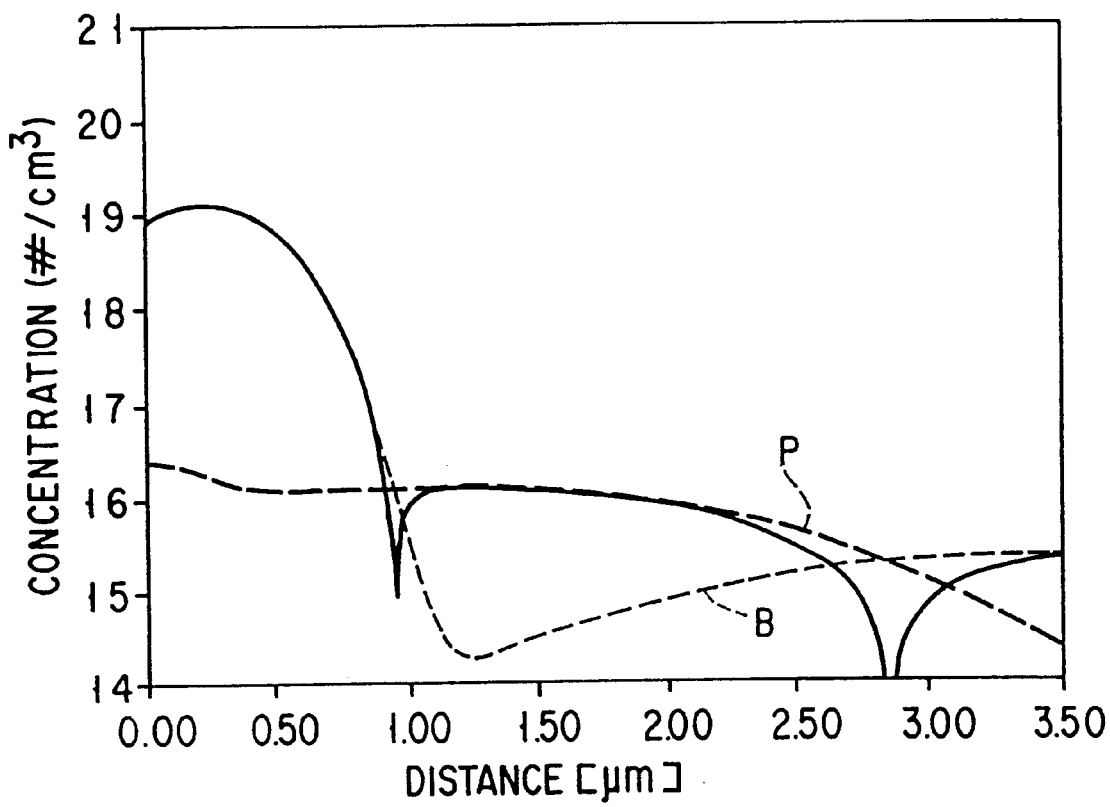
FIGS. 10A and 10B are a graph and a table respectively showing a simulation result immediately below the drain/source of the PMOS in the prior art.
Figures 11A, 11B:
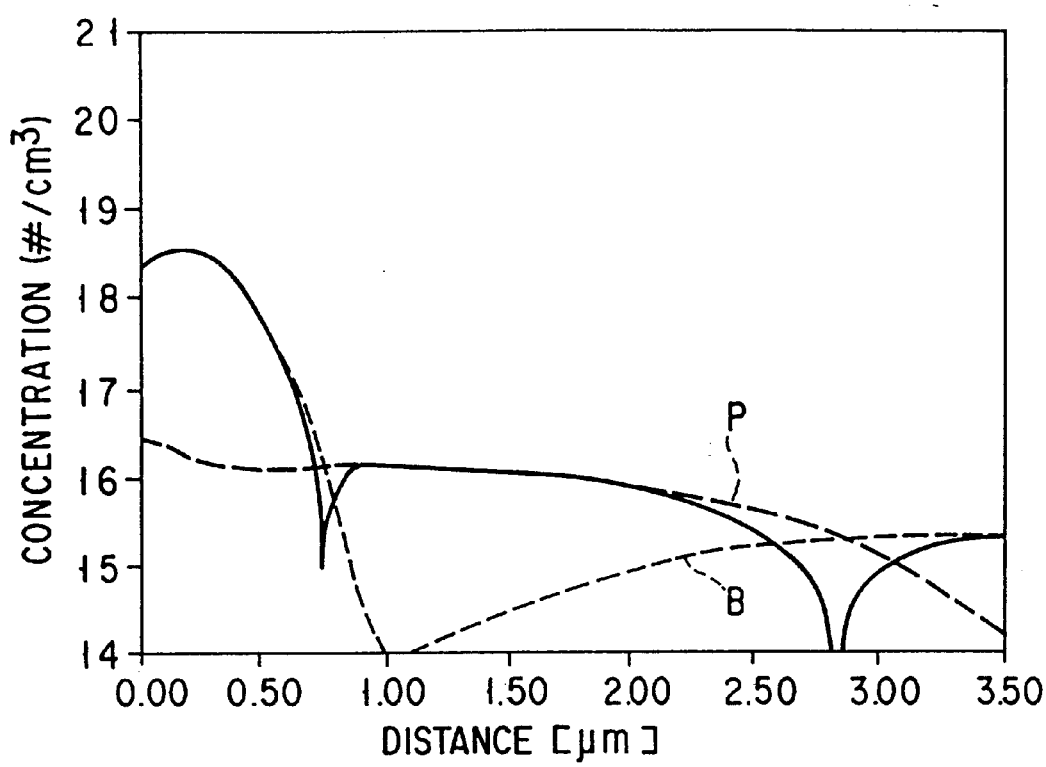
FIGS. 11A and 11B are a graph and a table respectively showing a simulation result immediately below the drain/source of a PMOS in the third embodiment.

Similarly, FIGS. 9A, 9B, 10A, and 10B show the simulation results of the relationships between the impurity concentrations and the depth from the substrate surface in the prior art. FIGS. 11A and 11B show the simulation result of the relationship between the impurity concentration and the depth from the substrate surface in the third embodiment. In particular, FIG. 9A represents the impurity profile immediately below a PMOS transistor, and FIG. 10A represents the impurity profile immediately below the source/drain of the PMOS transistor. FIG. 11A represents the impurity profile immediately below the source/drain of a PMOS transistor. FIGS. 9B, 10B, and 11B show the dose and the acceleration voltage used at that time. As is apparent from a comparison between FIGS. 10A and 11A, almost the same impurity profile as that of the conventional manufacturing process is also obtained in this embodiment.

According to the third embodiment, a lithography step for forming P-diffusion layers serving as the source and drain of a PMOS transistor can be eliminated.

Figure 12A:
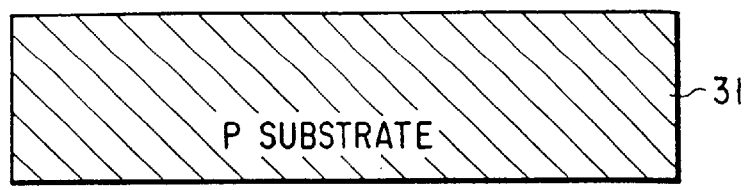
FIGS. 12A to 12D are views for explaining a method of manufacturing a well layer according to the fourth embodiment of the present invention.
Figure 12B:
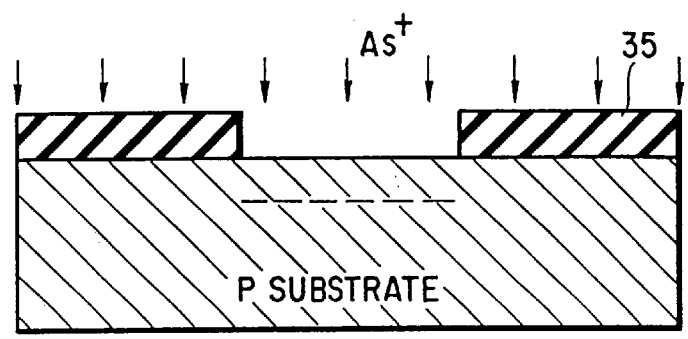
Figure 12C:
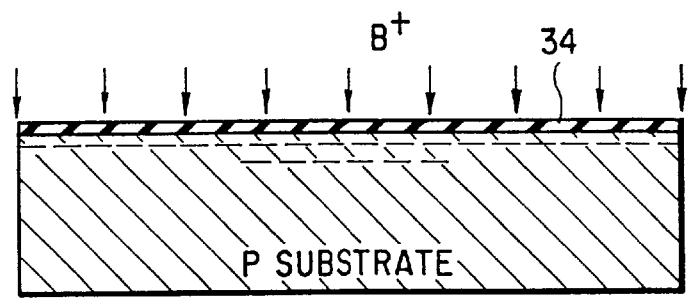

The fourth embodiment of the present invention will be described below with reference to FIGS. 12A to 12D. In the fourth embodiment, N- and P-well layers are formed on a substrate. In FIGS. 12A to 12D, an N-type impurity (e.g., arsenic As$^+$ or phosphorus) is ion-implanted or diffused in a region for forming the N-well layer of a P substrate 31 made of an Si wafer at an acceleration voltage of 60 [keV] and a dose of 5E15 [cm$^{-2}$] (FIGS. 12A and 12B). After a resist 35 is removed, a P-type impurity (e.g., boron B$^+$) is ion-implanted in the entire surface of the P substrate 31 at an acceleration voltage 5 [keV] and a dose of 2E15 [cm$^{-2}$] (FIG. 12C). The P-type impurity may be BF$_2$. Next, wet oxidation is performed in an H$_2$/O$_2$ or H$_2$O atmosphere at 950° C. for about 30 min to form an oxide film 34. Owing to this oxidation, the oxidation progresses faster in a region containing the N-type impurity than in a region containing no N-type impurity, and the oxide film 34 which is formed on an N-type impurity region has a larger thickness compared with the thickness of the oxide film 34 formed on the other regions.

Figure 12D:
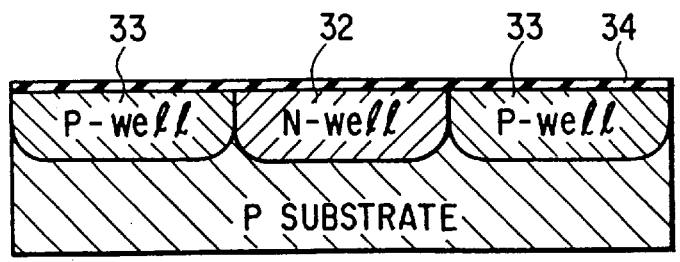
Figure 14A:
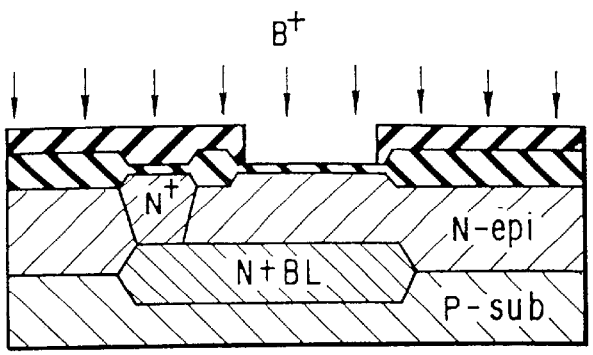
FIGS. 14A to 14D are views for explaining a method of manufacturing a vertical NPN transistor when the prior art is used.
Figure 14B:
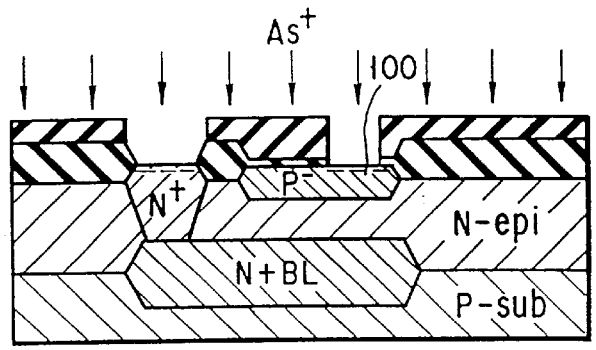
Figure 14C:
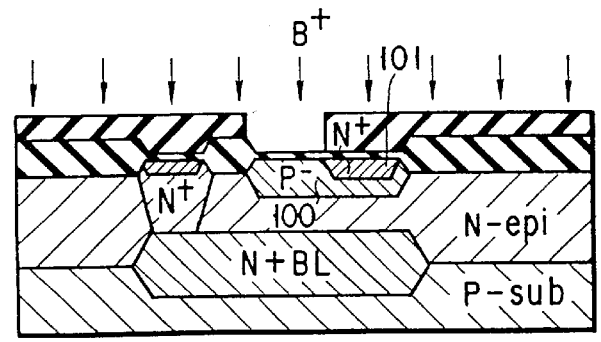
Figure 14D:
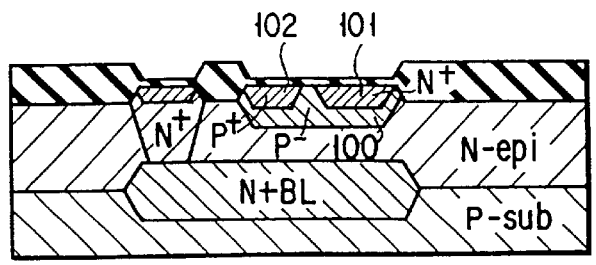

In addition, since the diffusion coefficient of the P-type impurity is larger than those of the N-type impurity, the P-type impurity is mainly diffused in the oxide film 34 having a larger thickness, as far as a region containing both the N- and P-type impurities are concerned, with the result that a larger amount N-type impurity remains in the substrate. As a result, an N-well layer 32 is formed in the substrate, and P-well layers 33 are formed in remaining regions (FIG. 12D).

The P-type impurity existing in the N-well layer 32 does not increase the resistance value of the N-well layer because the P-type impurity is sufficiently lower in concentration than the N-type impurity. By using the above method, alignment of interfaces between P- and N-wells and the problem of concentration canceling in the N- and P-wells need not be taken into consideration. The P substrate is used in the fourth embodiment, but an N substrate may be used.

According to the fourth embodiment, a PEP step need not be performed in ion-implanting a P-type impurity. Therefore, the manufacturing time can be shortened, and the cost can be reduced.

The fifth embodiment of the present invention will be explained below with reference to FIGS. 13A to 13D. In the fifth embodiment, N- and P-buried layers are self-aligningly formed in a substrate. First, an N-type impurity (e.g., arsenic As$^+$ or phosphorus) is ion-implanted in a region for forming the N-buried layer of a P substrate 41 made of an Si wafer under the conditions of an acceleration voltage of 60 [keV] and a dose of 5E15 [cm$^{-2}$] (FIG. 13A). A resist 46 is removed, and a P-type impurity (e.g., boron B$^+$) is ion-implanted in the entire surface of the substrate at an acceleration voltage of 5 [keV] and a dose of 2E15 [cm$^{-2}$] (FIG. 13B). Wet oxidation is performed in an H$_2$/O$_2$ or H$_2$O atmosphere at a temperature of 950° C. for about 30 min to form an oxide film 44, as shown in FIG. 13C.

At this time, the oxidation progresses faster in a region containing the N-type impurity than in a region containing no N-type impurity, and the oxide film 44 which is formed on an N-type impurity region has a larger thickness compared with the thickness of the oxide film 44 formed on the other regions.

In addition, since the diffusion coefficient of the P-type impurity is larger than those of the N-type impurity, the P-type impurity is mainly diffused in the oxide film 44 having a larger thickness, as far as a region containing both the N- and P-type impurities are concerned. As a result of this, a larger amount of N-type impurity remains in the substrate 41 to form an N-buried layer 43 in the substrate, and P-buried layers 42 are formed in remaining regions. Thereafter, the oxide film 44 is removed to form an epitaxially grown layer 45 (FIG. 13D).

The P-type impurity left in the N-buried layer does not increase the resistance value of the N-buried layer because the P-type impurity is sufficiently lower in concentration than the N-type impurity.

Although arsenic or phosphorus is used as an N-type impurity, another impurity can be used. BF$_2$ can be used as a P-type impurity. In addition, doping of an impurity into an Si wafer is not limited to ion implantation, and another method such as diffusion can be employed.

According to the fifth embodiment, a lithography step in ion-implanting a P-type impurity and an oxidation step for self alignment can be eliminated to shorten the manufacturing time and reduce the manufacturing cost.

According to the present invention, the manufacturing method in the prior art can be simplified to shorten the manufacturing time and reduce the manufacturing cost. At the same time, the size of a device pattern can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

the first step of doping an N-type impurity via a selective region formed on a semiconductor substrate by lithography;

the second step of doping a P-type impurity over an entire surface of said semiconductor substrate subsequent to the first doping step without forming a selective region by lithography, so as to form a first region including mainly the P-type impurity and a second region including both the N-type impurity and the P-type impurity;

the step of performing wet oxidation with respect to the semiconductor substrate so as to form an oxide film; and the step of performing annealing with respect to the semiconductor substrate, so as to form a P-type outer base from the first region, and an N-type emitter and a P-type inner base from the first region, and as a result of the annealing, the P-type outer base and the N-type emitter being formed simultaneously in self-alignment with one another, and the P-type outer base and the P-type inner base having different impurity profiles with one another 2. A method according to claim 1, wherein the N-type collector is a deep N-type buried diffusion layer.

3. A method according to claim 1, wherein the N-type impurity is one of phosphorus and arsenic, and the P-type impurity is boron.

4. A method according to claim 1, wherein the N-type impurity is one of phosphorus and arsenic, and the P-type impurity is $BF_2$.

5. The method of manufacturing a semiconductor device according to claim 1, wherein the P-type inner base is heavily-doped and the P-type inner base is lightly-doped.

6. The method of manufacturing a semiconductor device according to claim 1, wherein the P-type inner base is formed at a deeper position of a semiconductor substrate than the N-type emitter.

7. The method of manufacturing a semiconductor device according to claim 1, wherein the P-type outer base is formed at a position of a semiconductor substrate deeper than the P-type inner base.

8. A method of manufacturing a semiconductor device, comprising:

the step of introducing an N-type impurity into a first region of a semiconductor substrate;

the step of introducing an P-type impurity into a second region of the semiconductor substrate, the second region including the first region;

the step of forming by performing wet oxidation an oxide film on a surface of the first region of the semiconductor substrate for absorbing the P-type impurity introduced in the first region into the oxide film; and the step of performing annealing with respect to the semiconductor substrate, so as to form a P-type outer base from the second region except the first region and an N-type emitter and a P-type inner base from the first region, and as a result of the annealing, the P-type outer base and the N-type emitter are formed simultaneously in self-alignment with one another, and the P-type outer base and the P-type inner base are formed simultaneously in self-alignment with one another, so that the P-type outer base and the P-type inner base have different impurity profiles with one another.

9. A method of manufacturing a semiconductor device according to claim 8, wherein when the first oxide film is formed, a second oxide film is formed on the second region excluding the first region, the thickness of the second oxide film being smaller than those of the first oxide film.

10. A method of manufacturing a semiconductor device according to claim 8, wherein the step of absorbing the P-type impurity introduced in the first region into the first oxide film includes annealing.

11. A method of manufacturing a semiconductor device according to claim 8, wherein an element-separating insulating film is selectively formed on the second region of the semiconductor substrate.

12. A method of manufacturing a semiconductor device according to claim 11, wherein the first region of the semiconductor substrate is a collector forming region and an emitter forming region of an NPN transistor, and the second region excluding the first region is a base forming region of the NPN transistor.

13. A method of manufacturing a semiconductor device according to claim 8, wherein the first region of the semiconductor substrate is a collector forming region and an emitter forming region of an NPN transistor, and the second region excluding the first region is a base forming region of the NPN transistor.

14. A method of manufacturing a semiconductor device according to claim 8, wherein the first region of the semiconductor substrate is a collector forming region and an emitter forming region of an NPN transistor, and the second region excluding the first region is a base forming region of the NPN transistor.

15. The method of manufacturing a semiconductor device according to claim 8, wherein the P-type inner base is formed at a deeper position of a semiconductor substrate than the N-type emitter.

16. The method of manufacturing a semiconductor device according to claim 8, wherein the P-type outer base is formed up to a position of a semiconductor substrate deeper than the P-type inner base.

* * * * *

UNITED STATES PATENT AND TRADEMARK OFFICE
CERTIFICATE OF CORRECTION

PATENT NO. : 6,316,324 B1  
DATED : November 13, 2001  
INVENTOR(S) : Honna et al.

Page 1 of 1

It is certified that error appears in the above-identified patent and that said Letters Patent is hereby corrected as shown below:

Column 8,
Line 53, the claim should be deleted in its entirety and replaced with the following:
-- 14. The method of manufacturing a semiconductor device according to claim 8, wherein an impurity concentration of the P-type inner base is lower than that of the P-type outer base by an amount of the P-type impurity absorbed into the oxide film. --

Signed and Sealed this

Nineteenth Day of November, 2002

*Attest:*

*Attesting Officer*

JAMES E. ROGAN
*Director of the United States Patent and Trademark Office*